(12) United States Patent
Xu et al.

(10) Patent No.: US 10,534,951 B2
(45) Date of Patent: Jan. 14, 2020

(54) FINGERPRINT IDENTIFICATION UNIT AND MANUFACTURING METHOD THEREOF, ARRAY SUBSTRATE, DISPLAY DEVICE AND FINGERPRINT IDENTIFICATION METHOD

(71) Applicant: BOE TECHNOLOGY GROUP CO., LTD., Beijing (CN)

(72) Inventors: Rui Xu, Beijing (CN); Haisheng Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 230 days.

(21) Appl. No.: 15/576,800

(22) PCT Filed: May 26, 2017

(86) PCT No.: PCT/CN2017/086109
§ 371 (c)(1),
(2) Date: Nov. 24, 2017

(87) PCT Pub. No.: WO2018/032855
PCT Pub. Date: Feb. 22, 2018

(65) Prior Publication Data
US 2018/0239943 A1    Aug. 23, 2018

(30) Foreign Application Priority Data

Aug. 15, 2016    (CN) .......................... 2016 1 0670942

(51) Int. Cl.
*G06K 9/00*    (2006.01)
*H01L 27/146*    (2006.01)
*H01L 27/32*    (2006.01)

(52) U.S. Cl.
CPC ...... *G06K 9/0004* (2013.01); *H01L 27/14678* (2013.01); *H01L 27/3234* (2013.01)

(58) Field of Classification Search
CPC .............. G06K 9/0004; G06K 9/00006; H01L 27/14678; H01L 27/3234
See application file for complete search history.

(56) References Cited

U.S. PATENT DOCUMENTS 6,747,290 B2 *   6/2004   Yamazaki ........... G06F 3/03545
                                                                257/53
7,602,380 B2 *   10/2009   Yoshida .................. G06F 3/042
                                                                175/207

(Continued)

FOREIGN PATENT DOCUMENTS

CN      101996006 A     3/2011
CN      105047689 A    11/2015

(Continued)

OTHER PUBLICATIONS

First Office Action for Chinese Patent Application No. 201610670942.X dated May 8, 2017.

(Continued)

*Primary Examiner* — Shefali D Goradia
(74) *Attorney, Agent, or Firm* — Calfee, Halter & Griswold LLP

(57) ABSTRACT

A fingerprint identification unit and a manufacturing method thereof, an array substrate, a display device and a fingerprint identification method are disclosed, which can realize fingerprint identification without increasing the thickness of the display device. The fingerprint identification unit can include a photosensitive device, a data read-out signal line and a thin film transistor for controlling the switching of the photosensitive device. On the photosensitive device is formed a first insulating layer for insulating the photosensitive device from an OLED luminescent layer, and the part of the OLED luminescent layer corresponding to the photosensitive device does not illuminate. The data read-out signal line can be configured to read out a photocurrent (Continued)

generated by the photosensitive device, and identify fingerprints according to the amount of each photocurrent. The array substrate includes the fingerprint identification unit mentioned in the above technical solution.

19 Claims, 3 Drawing Sheets

(56) References Cited

U.S. PATENT DOCUMENTS

| | | | | |
|---|---|---|---|---|
| 7,920,215 | B2* | 4/2011 | Okamoto | G02F 1/13338 349/12 |
| 8,619,208 | B2* | 12/2013 | Gosain | G02F 1/1368 349/48 |
| 9,542,022 | B2* | 1/2017 | Kozuma | G06F 3/042 |
| 2010/0085331 | A1* | 4/2010 | Kurokawa | G06F 1/1616 345/175 |
| 2011/0043473 | A1 | 2/2011 | Kozuma | |
| 2016/0219196 | A1 | 7/2016 | Verilhac | |
| 2017/0220839 | A1 | 8/2017 | Yang et al. | |
| 2017/0221972 | A1 | 8/2017 | Yang et al. | |
| 2018/0151639 | A1* | 5/2018 | Luo | G06K 9/00033 |

FOREIGN PATENT DOCUMENTS

| | | |
|---|---|---|
| CN | 105095877 A | 11/2015 |
| CN | 105550662 A | 5/2016 |
| CN | 106326845 A | 1/2017 |
| EP | 3048562 A1 | 7/2016 |

OTHER PUBLICATIONS

Search Report for International Patent Application No. PCT/CN2017/086109 dated Aug. 31, 2017.

Search Report for Chinese Patent Application No. 201610670942.X dated Feb. 28, 2017.

* cited by examiner

FINGERPRINT IDENTIFICATION UNIT AND MANUFACTURING METHOD THEREOF, ARRAY SUBSTRATE, DISPLAY DEVICE AND FINGERPRINT IDENTIFICATION METHOD

RELATED APPLICATIONS

The present application is the U.S. national phase entry of PCT/CN2017/086109 with an International filing date of May 26, 2017, which claims the benefit of Chinese Patent Application No. 201610670942.X, filed on Aug. 15, 2016, the entire disclosure of which is incorporated herein by reference.

TECHNICAL FIELD

The present invention relates to the field of display technology, and more particular to a fingerprint identification unit and a manufacturing method thereof, an array substrate, an OLED display panel and a fingerprint identification method.

BACKGROUND ART

With the development of display technology, a display device provides an increasingly better display effect to bring good visual experience to people. Due to the improvement of living standards, the requirement for display devices is not limited to the display effect only, and a variety of display functions are on demand as well. For instance, the existing display device combines image display and fingerprint identification technologies to form a display device having a fingerprint identification function.

SUMMARY

In an existing display device having a fingerprint identification function, a fingerprint identification unit is usually made on the outer side of a display panel of the display device. Although such a display device has the fingerprint identification function, since the fingerprint identification unit is disposed on the outer side of the display panel in the display device, it would greatly increase the thickness of the display device, which is disadvantageous to the development of a lightweight and thin display device.

Thus, it is desired in the art to provide a fingerprint identification unit and a manufacturing method thereof, an array substrate, a display device and a fingerprint identification method, so as to identify fingerprints without increasing the thickness of the display device.

To address or alleviate at least one defect in the prior art, there is provided a fingerprint identification unit according to one aspect. The fingerprint identification unit can comprise a photosensitive device, a data read-out signal line and a thin film transistor for controlling the switching of the photosensitive device. The gate of the thin film transistor is electrically connected with a control signal line that can be configured to control the switching of the thin film transistor. On the photosensitive device is formed a first insulating layer for insulating the photosensitive device from an OLED luminescent layer, and the part of the OLED luminescent layer corresponding to the photosensitive device does not illuminate. The data read-out signal line can be configured to read out a photocurrent generated by the photosensitive device.

In an embodiment, a first electrode of the photosensitive device can be electrically connected with a reference voltage data line, a source of the thin film transistor can be electrically connected with the data read-out signal line, and a drain of the thin film transistor can be electrically connected with a second electrode of the photosensitive device.

In an embodiment, the first electrode of the photosensitive device can be a P electrode, and the second electrode thereof can be an N electrode.

In an embodiment, the photosensitive device can be a PIN photosensitive device, a PN photosensitive device or a Schottky photosensitive device.

In an embodiment, the thin film transistor can comprise a buffer layer, an active layer, a gate insulating layer, a gate, a source and a drain. The active layer is formed on the buffer layer, the gate insulating layer is formed on the active layer, the gate, the source and the drain are respectively formed on the gate insulating layer, the gate insulating layer is provided with a first through-hole and a second through-hole, the source is electrically connected with the active layer by a first lead wire passing through the first through-hole, and the drain is electrically connected with the active layer by a second lead wire passing through the second through-hole.

In an embodiment, the fingerprint identification unit can also comprise a second insulating layer provided with a third through-hole, and the second insulating layer can be located between the thin film transistor and the first insulating layer. The photosensitive device can be located between the second insulating layer and the first insulating layer; and the second electrode of the photosensitive device can be electrically connected with the drain of the thin film transistor by a third lead wire passing through the third through-hole.

In an embodiment, a first protective layer can be formed between the lower surface of the second insulating layer and the thin film transistor. On the upper surface of the second insulating layer can also be formed a metal layer electrically connected with the reference voltage data line, and the photosensitive device can be formed on the metal layer. On the upper surface of the second insulating layer and around the photosensitive device can be formed a second protective layer for insulating the first electrode of the photosensitive device from the second electrode thereof. The first electrode of the photosensitive device can be in contact with the metal layer, and the second electrode thereof can be exposed out of the second protective layer that can be in contact with the first insulating layer. The first protective layer can be provided with a fourth through-hole, the second protective layer can be provided with a fifth through-hole, the fourth through-hole is in communication with the fifth through-hole via the third through-hole, and the third lead wire passes through the fourth through-hole and the fifth through-hole respectively.

According to another aspect, there is provided a manufacturing method of a fingerprint identification unit. The manufacturing method can comprise:

forming a thin film transistor, a photosensitive device, a control signal line and a data read-out signal line so that the thin film transistor controls the switching of the photosensitive device, the data read-out signal line reads out a photocurrent generated by the photosensitive device, a gate of the thin film transistor is electrically connected with the control signal line, a first electrode of the photosensitive device is electrically connected with a reference voltage data line; and forming a first insulating layer on the photosensitive device to obtain a fingerprint identification unit, the first insulating layer being used for insulating the photosensitive device from an OLED luminescent layer so that the part of the OLED luminescent layer corresponding to the photosensitive device does not illuminate.

In an embodiment, forming a thin film transistor can comprise:

forming a buffer layer, forming an active layer on the buffer layer, and forming a gate insulating layer on the active layer;

forming a gate on the gate insulating layer so that the gate is electrically connected with the control signal line;

forming a first through-hole and a second through-hole in the gate insulating layer by a patternizing process;

forming a first lead wire in the first through-hole and a second lead wire in the second through-hole;

forming a source and a drain on the gate insulating layer so that the source is electrically connected with the active layer by the first lead wire, the drain is electrically connected with the active layer by the second lead wire, the source is electrically connected with the data read-out signal line, and the drain is electrically connected with a second electrode of the photosensitive device to obtain the thin film transistor.

In an embodiment, the manufacturing method of the fingerprint identification unit also comprises:

forming a first protective layer on the source of the thin film transistor, the drain of the thin film transistor and the gate of the thin film transistor;

forming a second insulating layer on the first protective layer so that the lower surface of the second insulating layer is confronted with the first protective layer;

forming a metal layer connected with the reference voltage data line on the upper surface of the second insulating layer, wherein the photosensitive device is formed on the metal layer so that the first electrode of the photosensitive device is in contact with the metal layer;

forming a second protective layer on the upper surface of the second insulating layer and around the photosensitive device so that the first electrode of the photosensitive device is insulated from the second electrode thereof, the second electrode of the photosensitive device is exposed out of the second protective layer, and the second protective layer is in contact with the first insulating layer;

forming a fourth through-hole in the first protective layer, a third through-hole in the second insulating layer, and a fifth through-hole in the second protective layer by a patternizing process, the fourth through-hole being in communication with the fifth through-hole via the third through-hole; and forming a third lead wire in the second electrode of the photosensitive device, the fifth through-hole, the third through-hole and the fourth through-hole so that the second electrode of the photosensitive device is electrically connected with the drain of the thin film transistor by the third lead wire passing through the fifth through-hole, the third through-hole and the fourth through-hole.

In an embodiment, the control signal line and the gate of the thin film transistor can be formed by the patternizing process at the same time, and the data read-out signal line, the source of the thin film transistor and the drain of the thin film transistor can be formed by the patternizing process at the same time.

According to another aspect, there is provided an array substrate comprising any fingerprint identification unit as stated above.

In an embodiment, each pixel unit of the array substrate comprises a pixel compensation unit and a fingerprint identification unit, and the photosensitive device of the fingerprint identification unit corresponds to the non-illuminating area of the OLED luminescent layer.

In an embodiment, the pixel compensation unit and the fingerprint identification unit of each pixel unit are disposed on a base substrate.

According to another aspect, there is provided a display device comprising any array substrate as stated above.

According to another aspect, there is provided a fingerprint identification method using the display device as stated above. The fingerprint identification method can comprise:

providing a control signal by a control signal line of each of fingerprint identification units to a gate of a thin film transistor so that the thin film transistor turns on a photosensitive device;

receiving the light, which was emitted from the display device and reflected by the fingerprint area, by the photosensitive device of each of the fingerprint identification units so that a photoelectric conversion of the reflected light is conducted in the photosensitive device to generate a photocurrent;

reading out the amount of the photocurrent by a data read-out signal line of each of the fingerprint identification units so as to identify fingerprint valleys and fingerprint ridges of the fingerprint area according to the amount of the photocurrent read out by the data read-out signal line in the different fingerprint identification units.

In an embodiment, the fingerprint identification method also comprises: acquiring an operational state of the display device, and controlling the control signal line of each of the pixel compensation units to provide a control signal to the gate of the thin film transistor when the display device is in operation.

In comparison with the prior art, some embodiments of the present disclosure can achieve at least one of the following advantageous effects and/or other advantageous effects:

In the fingerprint identification unit provided by some embodiments, the thin film transistor can control the switching of the photosensitive device, the gate of the thin film transistor is electrically connected with the control signal line so that the control signal line can provide a control signal to the thin film transistor to enable the thin film transistor to control the photosensitive device to receive a light and generate a photocurrent. In addition, on the photosensitive device can be formed the first insulating layer, so that the photosensitive device is insulated from the corresponding part of the OLED luminescent layer by the first insulating layer. Even if the cathode of the part of the OLED luminescent layer corresponding to the photosensitive device is electrified, the part of the OLED luminescent layer corresponding to the photosensitive device will not illuminate because the anode of the part of the OLED luminescent layer corresponding to the photosensitive device is replaced by the first insulating layer. Thus, the fingerprint identification unit provided by some embodiments has the first insulating layer formed on the photosensitive device, so that the part of the OLED luminescent layer corresponding to the photosensitive device never illuminates, thus ensuring that the fingerprint identification unit, if being disposed within the display device, will not directly receive the light emitted from the OLED luminescent layer, but only receive the light reflected into the display device from outside of the display device. When the fingerprint identification unit is applied within the display device, if a finger gets close to or in contact with the illuminating surface of the display device to reflect the light emitted from the display device back into the display device, the photosensitive device can receive the light, which was emitted from the display device and reflected by the fingerprint area, to generate a photocurrent that can be read out by the data read-out signal line. Since in a fingerprint area of a finger, fingerprint valleys and fingerprint ridges reflect different amounts of light, such that the light reflected by the fingerprint valleys and fingerprint ridges will generate different photocurrent amounts in the photosensitive device. Hence, the fingerprint identification unit provided by some embodiments can achieve the purpose of fingerprint identification by determining the amount of the photocurrent generated by the photosensitive device in each of the fingerprint identification units.

As known from the above analysis, the fingerprint identification unit provided by some embodiments can be placed within the display device for fingerprint identification purpose, with no need of disposing the fingerprint identification unit outside of the display panel. Hence, the fingerprint identification unit provided by some embodiments is applied in the display device, which will not increase the thickness of the display device and can lead the display device having a fingerprint identification function into a lightweight and thin direction.

BRIEF DESCRIPTION OF DRAWINGS

To explain the technical solutions of some embodiments more clearly, the present disclosure provides the following drawings for use when describing the embodiments. It shall be appreciated that the following drawings are only related to some embodiments. Without making inventive labor, those ordinarily skilled in the art can also obtain other drawings according to these drawings, and the other drawings are within the scope of the present invention. In the drawings.

REFERENCE SIGNS

| 1 First pixel unit, | 101 First pixel compensation unit; |
|---|---|
| 102 First OLED luminescent layer, | 103 First fingerprint identification unit; |
| 2 Second pixel unit, | 201 Second pixel compensation unit; |
| 202 Second OLED luminescent layer, | 203 Second fingerprint identification unit; |
| 3 Third pixel unit, | 301 Third pixel compensation unit; |
| 302 Third OLED luminescent layer, | 303 Third fingerprint identification unit; |
| 4 Base substrate, | 40 Buffer layer; |
| 400 Second insulating layer, | 401 First protective layer; |
| 402 Second protective layer, | 403 First insulating layer; |
| 41 Active layer, | 42 Gate insulating layer; |
| 43 Gate, | 44 Source; |
| 45 Drain, | 5 Cathode; |
| 6 Encapsulation structure, | 701 Fingerprint valley; |
| 702 Fingerprint ridge, | 8 Anode. |

DETAILED DESCRIPTION

For further explanation, a fingerprint identification unit and a manufacturing method thereof, an array substrate, a display device and a fingerprint identification method provided by some embodiments will be explained in detail with reference to the drawings.

Figure 1:
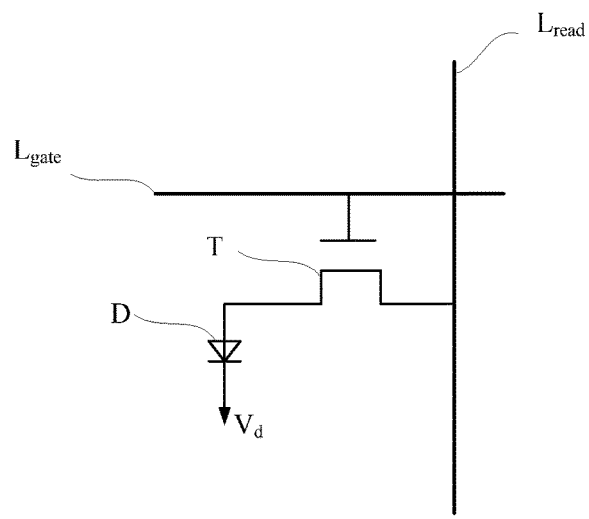
FIG. 1 is a structural schematic view of a fingerprint identification unit provided by an embodiment.
Figure 3:
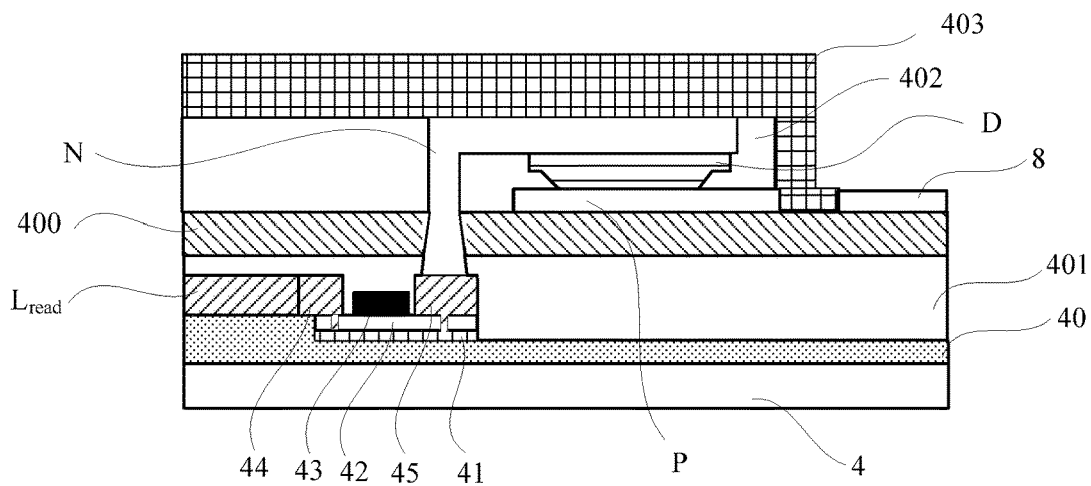
FIG. 3 is a detailed structural view of the fingerprint identification unit in FIG. 1.

FIG. 1 is a structural schematic view of a fingerprint identification unit provided by an embodiment, and FIG. 3 is a detailed structural view of the fingerprint identification unit in FIG. 1. As shown in FIGS. 1 and 3, the fingerprint identification unit according to an embodiment can comprise: a photosensitive device D, a data read-out signal line $L_{read}$ and a thin film transistor T for controlling the switching of the photosensitive device D. The gate of the thin film transistor T is electrically connected with a control signal line $L_{gate}$ that can be configured to control the switching of the thin film transistor T. On the photosensitive device D can be formed a first insulating layer for insulating the photosensitive device from an OLED luminescent layer, and the part of the OLED luminescent layer corresponding to the photosensitive device does not illuminate. The data read-out signal line $L_{read}$ can be configured to read out a photocurrent generated by the photosensitive device D.

Further, in the above embodiment, there can be a variety of specific structures for the data read-out signal line $L_{read}$ to read out the photocurrent generated by the photosensitive device D. For instance, as shown in FIGS. 1 and 3, a first electrode of the photosensitive device D can be electrically connected with a reference voltage data line $V_d$, a source 44 of the thin film transistor T can be electrically connected with the data read-out signal line $L_{read}$, and a drain 45 of the thin film transistor T can be electrically connected with a second electrode of the photosensitive device D.

In an exemplary embodiment, the first electrode of the photosensitive device D can be a P electrode, and the second electrode thereof can be an N electrode. Thus, when the photosensitive device D receives reflected light, a photocurrent being generated therein, the photocurrent can be obtained by the data read-out signal line $L_{read}$ through the drain 45 and the source 44 of the thin film transistor T to achieve the purpose of reading out the photocurrent by the data read-out signal line $L_{read}$.

What needs to be explained is that the thin film transistor and the photosensitive device in the fingerprint identification unit in the embodiment can be made in various structures, including the current structures of the thin film transistor and the photosensitive device, and the only thing to do is correspondingly configure and connect the thin film transistor and the photosensitive device according to the above embodiment, and then connect the same correspondingly with the control signal line $L_{gate}$ and the data read-out signal line $L_{read}$ as required.

For instance, the photosensitive device D can be specifically selected as a PIN photosensitive device, a PN photosensitive device or a Schottky photosensitive device or any other type of photosensitive device capable of conducting a photoelectric conversion. The thin film transistor T can be specifically selected as the one having a bottom-gate structure or a top-gate structure as long as the thin film transistor can control the switching of the photosensitive device D.

With reference to FIG. 3, there will be described a specific structure of the thin film transistor, as well as its connection and positional relationship with the photosensitive device D. The structure of the thin film transistor given below is only for illustration, rather than limitation, and the fingerprint identification unit can certainly use the thin film transistor of other structure.

As shown in FIG. 3, the thin film transistor T can comprise a buffer layer 40, an active layer 41, a gate insulating layer 42, a gate 43, a source 44 and a drain 45. The active layer 41 can be formed on the buffer layer 40. The gate insulating layer 42 can be formed on the active layer 41. The gate 43, the source 44 and the drain 45 can be respectively formed on the gate insulating layer 42. The gate insulating layer 42 can be provided with a first through-hole and a second through-hole. The source 44 can be electrically connected with the active layer 41 by a first lead wire passing through the first through-hole, and the drain 45 can be electrically connected with the active layer 41 by a second lead wire passing through the second through-hole.

Figure 2:
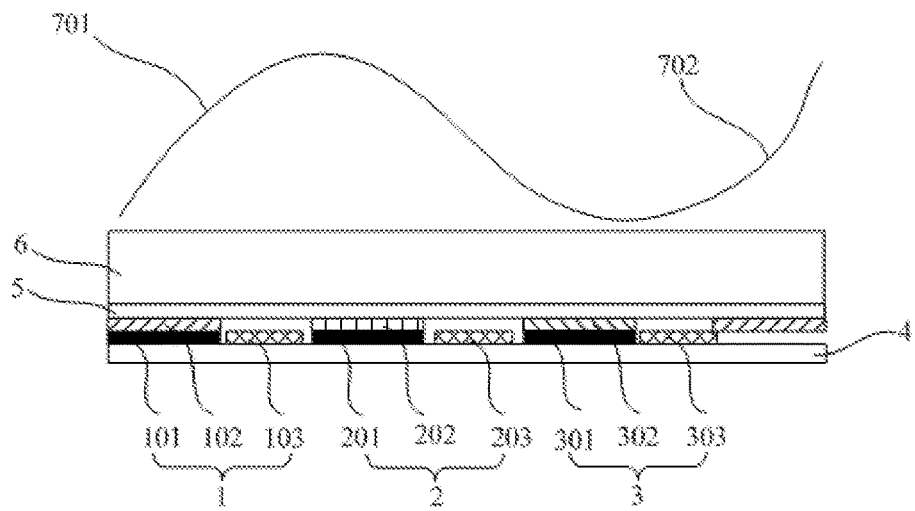
FIG. 2 is a partial schematic view of a display device provided by an embodiment.

FIG. 2 is a partial schematic view of a display device or display panel provided by an embodiment. FIG. 2 shows a part of the array substrate in the display panel. The array substrate can comprise a plurality of fingerprint identification units provided by any of the above embodiments.

As shown in FIG. 2, in the array substrate, each pixel unit 1, 2 and 3 can respectively comprise a pixel compensation unit 101, 201 and 301, an OLED luminescent layer 102, 202 and 302 and a fingerprint identification unit 103, 203 and 303. The photosensitive device of the fingerprint identification unit corresponds to the non-illuminating area of the OLED luminescent layer.

It can be understood that in the OLED display panel, the illuminating area and the non-illuminating area to which the OLED luminescent layer corresponds have a common cathode 5, and the illuminating area to which the OLED luminescent layer corresponds is provided at the other end with an anode 8, and the non-illuminating area to which the OLED luminescent layer corresponds is not provided at the other end with an anode 8 (see FIG. 3). Since the photosensitive device D of the fingerprint identification unit is provided with the first insulating layer 403, the first insulating layer 403 is used for insulating the photosensitive device D from the OLED luminescent layer. Hence, the first insulating layer 403 is substantively located between the photosensitive device D and the OLED luminescent layer.

It can be understood that a plurality of the pixel compensation units can be disposed on a base substrate 4, which may be a flexible substrate or a rigid substrate. In an embodiment, the fingerprint identification unit and the pixel compensation unit of each pixel unit can be made on the base substrate 4.

In an embodiment, one or more of the control signal line, the data read-out signal line and the thin film transistor in the fingerprint identification unit can correspond to the illuminating area of the OLED luminescent layer, or correspond to the non-illuminating area of the OLED luminescent layer. Moreover, the pixel compensation unit can correspond to the illuminating area of the OLED luminescent layer, or correspond to the non-illuminating area of the OLED luminescent layer. Selection can be made according to actual conditions.

The reference voltage data line in the pixel compensation unit can be electrically connected with the first electrode corresponding to the photosensitive device D in the fingerprint identification unit. The fingerprint identification unit is added to each pixel unit such that each pixel unit of the array substrate comprises not only the pixel compensation unit, but also the fingerprint identification unit, so as to achieve a full-screen fingerprint identification. Moreover, the fingerprint identification unit is disposed in the array substrate at a position corresponding to the non-illuminating area of the OLED luminescent layer, so as to ensure that the fingerprint identification unit can only receive the light reflected into the display device from outside of the display device.

The specific structure of the array substrate will be continuously explained with reference to FIG. 2. As shown in FIG. 2, the array substrate is shown to have three pixel units, namely, a first pixel unit 1, a second pixel unit 2 and a third pixel unit 3. It shall be pointed out that although only three pixel units are shown in the drawing, those skilled in the art can understand that the array substrate can comprise more pixel units.

As shown in FIG. 2, the plurality of fingerprint identification units 103, 203 and 303 can be disposed in the display device, wherein for the sake of integration of the control signal line $L_{gate}$ and the data read-out signal line $L_{read}$, the fingerprint identification units can be disposed on the non-illuminating area of the array substrate in the display device. As shown in FIGS. 2 and 3, the first pixel unit 1 can comprise the first pixel compensation unit 101 and the first fingerprint identification unit 103. In the display panel, the OLED luminescent layer corresponding to the first pixel unit 1 is the first OLED luminescent layer 102. The anode 8 is integrated onto the side of the first OLED luminescent layer 102 that contacts the first pixel compensation unit 101, and the cathode 5 is provided on the side of the first OLED luminescent layer 102 that contacts with an encapsulation structure 6. The first pixel compensation unit 101 can be used to control whether to apply a voltage between the cathode 5 and the anode 8, namely, to control the illumination of the first OLED luminescent layer 102.

Further with reference to FIGS. 2 and 3, the second pixel unit 2 can comprise the second pixel compensation unit 201 and the second fingerprint identification unit 203. In the display panel, the OLED luminescent layer corresponding to the second pixel unit 2 is the second OLED luminescent layer 202. The anode 8 is integrated onto the side of the second OLED luminescent layer 202 that contacts the second pixel compensation unit 201, and the cathode 5 is provided on the side of the second OLED luminescent layer 202 that contacts with the encapsulation structure 6. The second pixel compensation unit 201 can be used to control whether to apply a voltage between the cathode 5 and the anode 8, namely, to control the illumination of the second OLED luminescent layer 202.

Further with reference to FIGS. 2 and 3, the third pixel unit 3 can comprise the third pixel compensation unit 301 and the third fingerprint identification unit 303. In the display panel, the OLED luminescent layer corresponding to the third pixel unit 3 is the third OLED luminescent layer 302. The anode 8 is integrated onto the side of the third OLED luminescent layer 302 that contacts the third pixel compensation unit 301, and the cathode 5 is provided on the side of the third OLED luminescent layer 302 that contacts with the encapsulation structure 6. The third pixel compensation unit 301 can be used to control whether to apply a voltage between the cathode 5 and the anode 8, namely, to control the illumination of the third OLED luminescent layer 302.

The encapsulation structure 6 in the above embodiment can be a conventional encapsulation structure corresponding to a TFE encapsulating method, or other realizable encapsulation structure.

It shall be noted that in the above embodiment, the photosensitive device D corresponds to the non-illuminating area of the OLED luminescent layer, and the part of the OLED luminescent layer corresponding to the photosensitive device does not illuminate, in such a way that the photosensitive device D can only receive the reflected light from outside, and will not receive the light directly emitted from the OLED luminescent layer.

In addition, each pixel compensation unit can, in fact, consist of a thin film transistor and a storage capacitor, and the thin film transistor in the pixel compensation unit can have the same structure as the thin film transistor in the fingerprint identification unit, or a different structure, which will not be limited herein.

In an embodiment, the thin film transistor in the pixel compensation unit can have the same structure as the thin film transistor in the fingerprint identification unit, so that the thin film transistor in the pixel compensation unit can be manufactured together with the thin film transistor in the fingerprint identification unit. For instance, when the gate of the thin film transistor in the pixel compensation unit is manufactured, the gate of the thin film transistor in the fingerprint identification unit can be manufactured by the same patternizing process. When the gate insulating layer is deposited, the gate insulating layer of the thin film transistor in the pixel compensation unit and the gate insulating layer of the thin film transistor in the fingerprint identification unit can be deposited at the same time. When the active layer of the thin film transistor in the pixel compensation unit is manufactured, the active layer of the thin film transistor in the fingerprint identification unit can be manufactured by the same patternizing process. When the source and the drain of the thin film transistor in the pixel compensation unit are manufactured, the source and the drain of the thin film transistor in the fingerprint identification unit can be manufactured by the same patternizing process.

In an implementation, the display device provided by the above embodiments can comprise any product or component having a display function, such as a mobile phone, a tablet computer, a TV, a display, a lap-top computer, a digital photo frame or a navigator.

Figure 4:
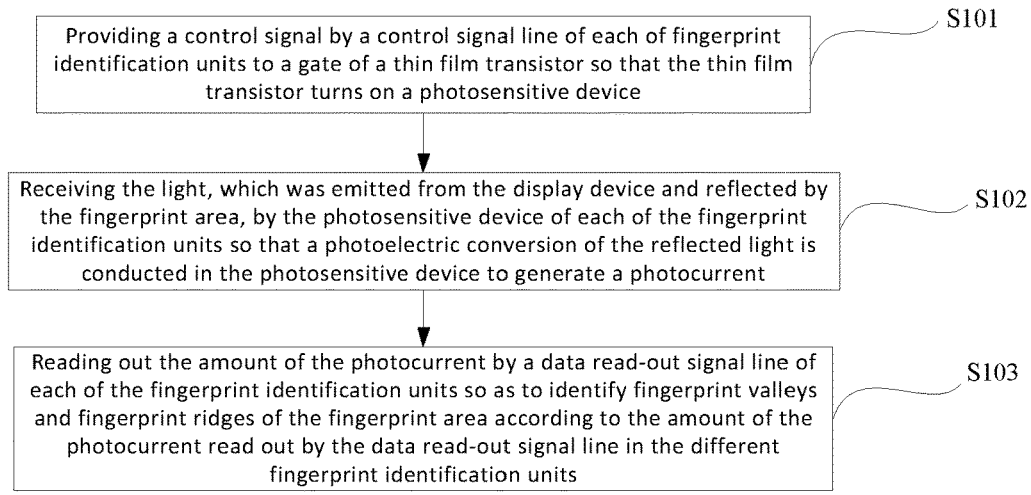
FIG. 4 is a flowchart of a fingerprint identification method provided by an embodiment.

FIG. 4 illustrates a flowchart of a fingerprint identification method provided by an embodiment. The fingerprint identification process conducted in the display device provided by the embodiment will be explained in detail with reference to FIG. 4. As shown in FIG. 4, the fingerprint identification method can comprise the steps of:

S101: providing a control signal by a control signal line $L_{gate}$ of each of fingerprint identification units to a gate of a thin film transistor T so that the thin film transistor T turns on a photosensitive device D;

S102: receiving the light, which was emitted from the display device and reflected by the fingerprint area, by the photosensitive device D of each of the fingerprint identification units so that a photoelectric conversion of the reflected light is conducted in the photosensitive device D to generate a photocurrent; and S103: reading out the amount of the photocurrent by a data read-out signal line $L_{read}$ of each of the fingerprint identification units so as to identify fingerprint valleys 701 and fingerprint ridges 702 of the fingerprint area according to the amount of the photocurrent read out by the data read-out signal line $L_{read}$ in the different fingerprint identification units.

In an embodiment, the fingerprint identification method can also comprise: acquiring an operational state of the display device, and controlling the control signal line of each of the pixel compensation units to provide a control signal to the gate of the thin film transistor when the display device is in operation.

As known from the structure of the fingerprint identification unit and its specific implementing process, in the fingerprint identification unit provided by some of the embodiments, the thin film transistor T can control the switching of the photosensitive device D, the gate of the thin film transistor T is electrically connected with the control signal line $L_{gate}$ so that the control signal line $L_{gate}$ can provide a control signal to the thin film transistor T to enable the thin film transistor to control the photosensitive device D to receive a light and generate a photocurrent. In addition, on the photosensitive device D can be formed the first insulating layer 403, so that the photosensitive device D is insulated from the OLED luminescent layer by the first insulating layer 403. Even if the cathode 5 of the part of the OLED luminescent layer corresponding to the photosensitive device D is electrified, the part of the OLED luminescent layer corresponding to the photosensitive device will not illuminate because the anode of the part of the OLED luminescent layer corresponding to the photosensitive device is replaced by the first insulating layer 403. Thus, the fingerprint identification unit provided by some embodiments has the first insulating layer 403 formed on the photosensitive device D, so that the part of the OLED luminescent layer corresponding to the photosensitive device D never illuminates, thus ensuring that the fingerprint identification unit, if being disposed within the display device, will not directly receive the light emitted from the OLED luminescent layer, but only receive the light reflected into the display device from outside of the display device. When the fingerprint identification unit is applied within the display device, if a finger gets close to or in contact with the illuminating surface of the display device to reflect the light emitted from the display device back into the display device, the photosensitive device D can receive the light, which was emitted from the display device and reflected by the fingerprint area, to generate a photocurrent that can be read out by the data read-out signal line $L_{read}$. Since in a fingerprint area of a finger, the interfaces of the fingerprint valleys 701 and fingerprint ridges 702 have different refractive indexes, such that the amounts of light reflected by the fingerprint valleys 701 and fingerprint ridges 702 are different, then resulting in different photocurrent amounts generated by reflected light corresponding to the fingerprint valleys 701 and fingerprint ridges 702 in the photosensitive device D. Hence, the fingerprint identification unit provided by some embodiments can achieve the purpose of fingerprint identification by determining the amount of the photocurrent generated by the photosensitive device D in each of the fingerprint identification units.

As known from the above analysis, the fingerprint identification unit provided by some embodiments can be placed within the display device for fingerprint identification purpose, with no need of disposing the fingerprint identification unit outside of the display panel. Hence, the fingerprint identification unit provided by some embodiments is applied in the display device, which will not increase the thickness of the display device and can lead the display device having a fingerprint identification function into a lightweight and thin direction.

Figure 5:
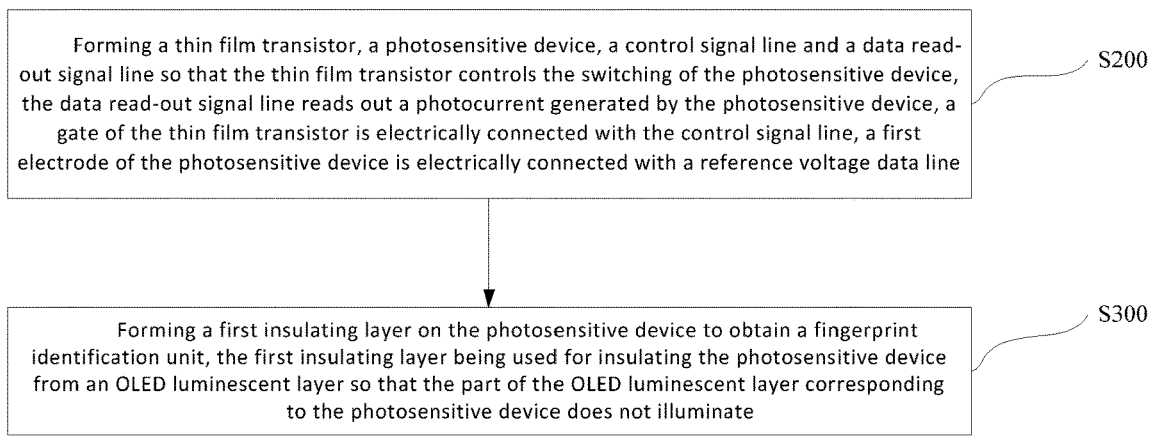
FIG. 5 is a flowchart of a manufacturing method of the fingerprint identification unit provided by an embodiment.

FIG. 5 illustrates a flowchart of a manufacturing method of the fingerprint identification unit provided by an embodiment. As shown in FIG. 5, the manufacturing method can comprise:

Step S200: forming a thin film transistor, a photosensitive device, a control signal line and a data read-out signal line so that the thin film transistor controls the switching of the photosensitive device, the data read-out signal line reads out a photocurrent generated by the photosensitive device, a gate of the thin film transistor is electrically connected with the control signal line, a first electrode of the photosensitive device is electrically connected with a reference voltage data line; and Step S300: forming a first insulating layer 403 on the photosensitive device D to obtain a fingerprint identification unit, the first insulating layer 403 being used for insulating the photosensitive device D from an OLED luminescent layer so that the part of the OLED luminescent layer corresponding to the photosensitive device does not illuminate.

It shall be explained that, in an embodiment, the data read-out signal line $L_{read}$, the source 44 of the thin film transistor T and the drain 45 of the thin film transistor T can be formed by the patternizing process at the same time.

Figure 6:
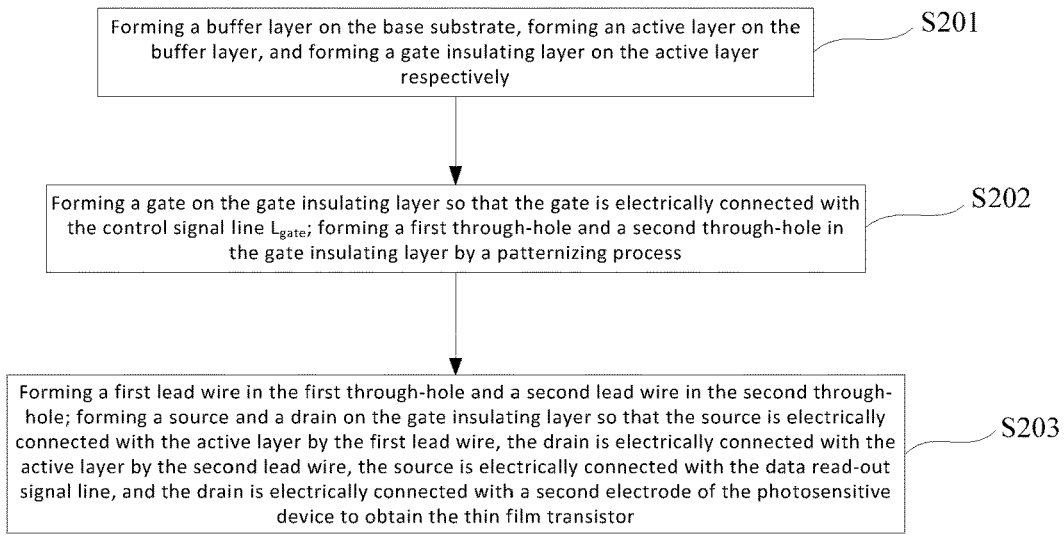
FIG. 6 is a flowchart of a manufacturing method of a thin film transistor provided by an embodiment.

FIG. 6 illustrates a flowchart of a manufacturing method of a thin film transistor provided by an embodiment. As shown in FIG. 6, the manufacturing method can comprise the steps of:

Step S201: forming a buffer layer 40 on a base substrate 4, forming an active layer 41 on the buffer layer 40, and forming a gate insulating layer 42 on the active layer 41;

Step S202: forming a gate 43 on the gate insulating layer 42 so that the gate 43 is electrically connected with the control signal line $L_{gate}$; and forming a first through-hole and a second through-hole in the gate insulating layer 42 by a patternizing process;

It can be understood that the gate 43 and the control signal line $L_{gate}$ can be formed by the patternizing process at the same time or formed separately. In an embodiment, the gate 43 and the control signal line $L_{gate}$ can be formed by the patternizing process at the same time so as to reduce the manufacturing steps;

Step S203: forming a first lead wire in the first through-hole and a second lead wire in the second through-hole; forming a source 44 and a drain 45 on the gate insulating layer so that the source 44 is electrically connected with the active layer 41 by the first lead wire, the drain 45 is electrically connected with the active layer 41 by the second lead wire, the source 44 is electrically connected with the data read-out signal line $L_{read}$, and the drain 45 is electrically connected with a second electrode of the photosensitive device D to obtain the thin film transistor. In an exemplary implementation, the drain 45 can be electrically connected with the N electrode of the photosensitive device D.

In an embodiment, the source 44 and the drain 45 in the step S203 are formed by the patternizing process at the same time. In another embodiment, since the source 44 is electrically connected with the data read-out signal line $L_{read}$, the data read-out signal line $L_{read}$ can be made together with the source 44 and the drain 45, that is to say, the data read-out signal line $L_{read}$, the source 44 of the thin film transistor and the drain 45 of the thin film transistor can be formed by the patternizing process at the same time.

It shall be explained that the step of forming a first through-hole and a second through-hole in the gate insulating layer 42 by the patternizing process can be conducted immediately after the step S201 finishes, or after forming the gate 43 on the gate insulating layer 42. However, if the step of forming a first through-hole and a second through-hole in the gate insulating layer 42 is conducted after forming the gate 43 on the gate insulating layer 42, no metal residues will be left in the first through-hole and the second through-hole. If the step of forming a first through-hole and a second through-hole in the gate insulating layer 42 by the patternizing process is conducted before forming the gate 43 on the gate insulating layer 42, the metal for making the gate is likely to be left in the first through-hole and the second through-hole. However, since it is also required in step S203 to form the conductive first and second lead wires in the first and second through-holes, even if the metal for making the gate is left in the first through-hole and the second through-hole, it will not have an impact on the subsequent steps and the use of the thin film transistor.

Moreover, in S203, although the step of forming a first lead wire in the first through-hole and a second lead wire in the second through-hole is conducted before the step of forming a source 44 and a drain 45 on the gate insulating layer 42, it does not mean that the step of forming a first lead wire in the first through-hole and a second lead wire in the second through-hole is necessary. For instance, while forming the source 44 and the drain 45 on the gate insulating layer, the material for manufacturing the source 44 and the drain 45 can be simultaneously formed in the first through-hole and the second through-hole, such that the material deposited in the first through-hole is used as the first lead wire, and the material formed in the second through-hole is used as the second lead wire. It can be seen that the first lead wire needs to exist in the first through-hole and the second lead wire needs to exist in the second through-hole, but the first lead wire and the second lead wire can be manufactured while the source 44 and the drain 45 are made. In other words, the first and second lead wires, as well as the source 44 and the drain 45, can be manufactured by the patternizing process at the same time.

Additionally, as shown in FIG. 3, the fingerprint identification unit in the above embodiment can also comprise a second insulating layer 400 provided with a third through-hole, and the second insulating layer 400 can be located between the thin film transistor T and the first insulating layer 403. The photosensitive device D can be located between the second insulating layer 400 and the first insulating layer 403. The second insulating layer 400 can be made of an insulating material such as a resin material. The second electrode of the photosensitive device D can be electrically connected with the drain 45 of the thin film transistor T by a third lead wire N passing through the third through-hole. Since the second insulating layer 400 is disposed between the thin film transistor T and the first insulating layer 403 and the photosensitive transistor D is located between the second insulating layer 400 and the first insulating layer 403, the possibility of a short circuit between the photosensitive device D and the thin film transistor T can be avoided. Provision of the third through-hole in the second insulating layer 400 can ensure that the second electrode of the photosensitive device is electrically connected with the drain 45 of the thin film transistor T by the third lead wire N passing through the third through-hole, so as to read out the photocurrent.

Furthermore, with reference to FIG. 3, in the above embodiments, a first protective layer 401 can be formed between the lower surface of the second insulating layer 400 and the thin film transistor T. On the upper surface of the second insulating layer 400 can also be formed a metal layer P electrically connected with the reference voltage data line, and the photosensitive device D can be formed on the metal layer P. The upper surface of the second insulating layer 400 and around the photosensitive device D can be formed a second protective layer 402 for insulating the first electrode of the photosensitive device D from the second electrode thereof. The first electrode of the photosensitive device D can be in contact with the metal layer P, and the second electrode thereof can be exposed out of the second protective layer 402 that can be in contact with the first insulating layer 403. The first protective layer 401 can be provided with a fourth through-hole, the second protective layer 402 can be provided with a fifth through-hole, the fourth through-hole is in communication with the fifth through-hole via the third through-hole, and the third lead wire N passes through the fourth through-hole and the fifth through-hole respectively.

In some embodiments, the first insulating layer 403, the second insulating layer 400, the first protective layer 401 and the second protective layer 402 are all made of an insulating material, such as a common resin material.

The first protective layer 401 can be formed between the lower surface of the second insulating layer 400 and the thin film transistor T, so that the first protective layer 401 can protect the thin film transistor T. On the upper surface of the second insulating layer 400 and around the photosensitive device D can be formed the second protective layer 402 for insulating the first electrode of the photosensitive device D from the second electrode thereof, which can prevent electrical connection between the first electrode and the second electrode and on the other hand protect the photosensitive device D. Moreover, the second electrode can be exposed out of the second protective layer 402, the first protective layer 401 is provided with a fourth through-hole, the second protective layer 402 is provided with a fifth through-hole, and the fourth through-hole is in communication with the fifth through-hole via the third through-hole, so that the third lead wire N passes through the third through-hole, the fourth through-hole and the fifth through-hole to make the second electrode of the photosensitive device D electrically connected with the drain 45 of the thin film transistor T to read out the photocurrent. Further, since the metal layer P is electrically connected with the reference voltage data line, the metal layer can work as a lead wire to set up a bridge for electric connection between the reference voltage data line and the second electrode of the photosensitive device D. Also, for the sake of simplified manufacturing process, the metal layer P and the reference voltage data line can be formed by the patternizing process at the same time.

Figure 7:
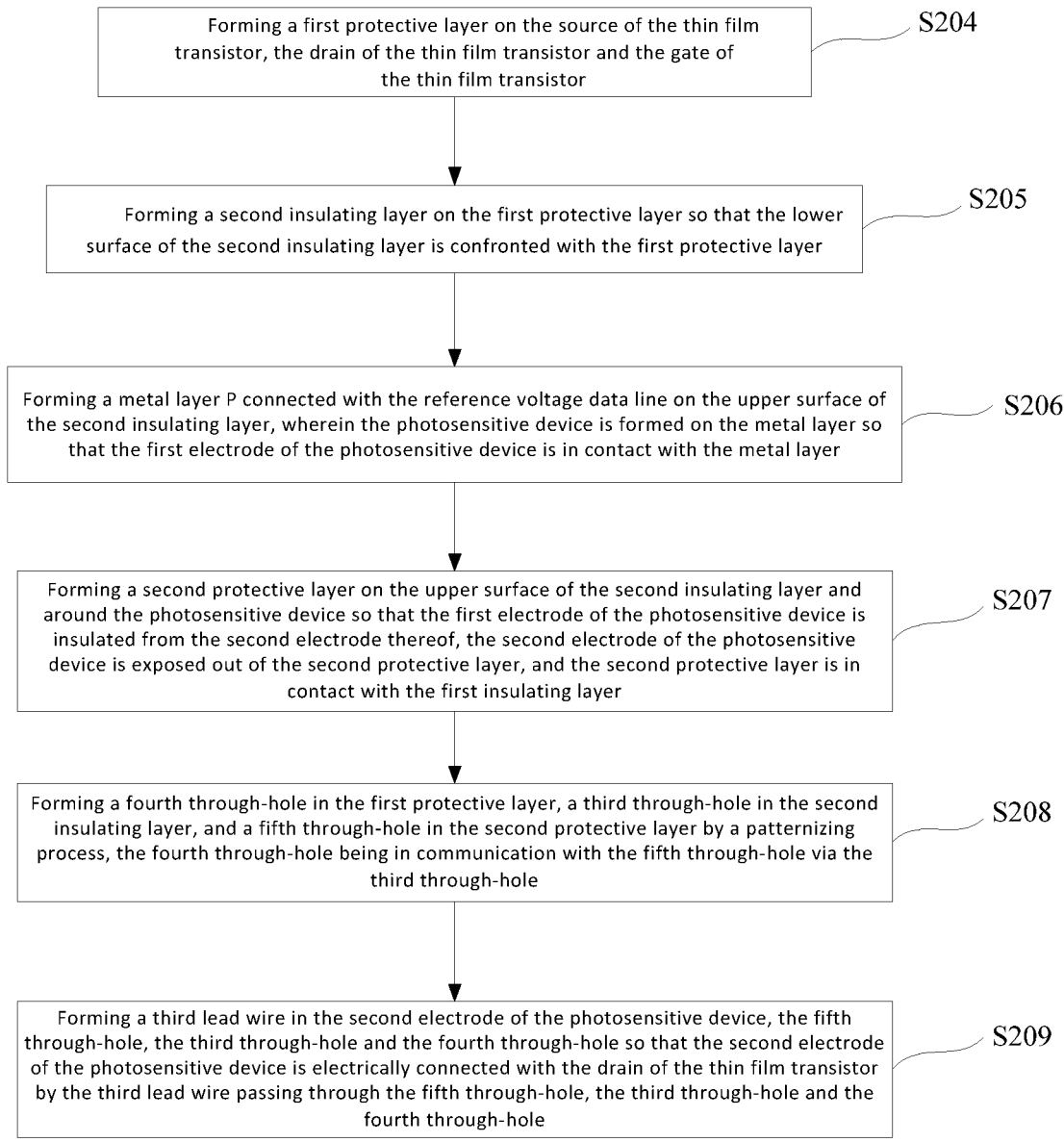
FIG. 7 is a flowchart of a further manufacturing method of the fingerprint identification unit provided by an embodiment.

The above structure is additionally arranged on the basis of the thin film transistor T and the photosensitive device D. In the production of the fingerprint identification unit, the above structure is made after the making of the thin film transistor T. FIG. 7 illustrates a flowchart of a further manufacturing method of the structures of the fingerprint identification unit provided by an embodiment. The manufacturing process of the structures will be explained in detail with reference to FIG. 7:

Step S204: forming the first protective layer 401 on the source 44 of the thin film transistor T, the drain 45 of the thin film transistor T and the gate 43 of the thin film transistor T;

Step S205: forming the second insulating layer 400 on the first protective layer 401 so that the lower surface of the second insulating layer 400 is confronted with the first protective layer 401 of the thin film transistor T;

Step S206: forming the metal layer P connected with the reference voltage data line on the upper surface of the second insulating layer 400, wherein the photosensitive device D is formed on the metal layer P so that the first electrode of the photosensitive device D is in contact with the metal layer P. The metal layer P can function as the lead wire in connection with the reference voltage data line. For instance, the P electrode of the photosensitive device D can be in contact with the metal layer P.

Step S207: forming the second protective layer 402 on the upper surface of the second insulating layer 400 and around the photosensitive device D so that the first electrode of the photosensitive device D is insulated from the second electrode thereof, the second electrode of the photosensitive device D is exposed out of the second protective layer 402, and the second protective layer 402 is in contact with the first insulating layer 403.

For instance, the P electrode of the photosensitive device D is insulated from the N electrode thereof, the N electrode of the photosensitive device D is exposed out of the second protective layer 402, and the second protective layer 402 is in contact with the first insulating layer 403. In an example, the P electrode of the photosensitive device D is in contact with the metal layer P, and the N electrode of the photosensitive device D is electrically connected with the drain 45 of the thin film transistor T by the third lead wire N.

Step S208: forming the fourth through-hole in the first protective layer 401, the third through-hole in the second insulating layer 400, and the fifth through-hole in the second protective layer 402 by the patternizing process, the fourth through-hole being in communication with the fifth through-hole via the third through-hole.

Step S209: forming the third lead wire N in the second electrode of the photosensitive device D, the fifth through-hole, the third through-hole and the fourth through-hole so that the second electrode of the photosensitive device D is electrically connected with the drain 45 of the thin film transistor T by the third lead wire. The third lead wire passes through the fifth through-hole, the third through-hole and the fourth through-hole.

Those ordinarily skilled in the art can understand that in the description of the above embodiments, the specific feature, structure, material or operation can be combined in any suitable manner in any one or more embodiments or examples.

It can be understood that the above embodiments are only exemplary embodiments of the present invention, but the protection scope of the present invention is not limited thereto. It shall be pointed out that those ordinarily skilled in the art can readily conceive of various variations or replacements without departing from the spirit and principle of the present invention. These variations or replacements will fall within the protection scope of the present invention. Thus, the protection scope of the present invention shall be based on the protection scope of the appended claims.

The present application uses such wordings as "first", "second" and "third". Unless specified in the context, such wordings do not imply any order, but are actually used for the purpose of identification. For instance, the phrases "first insulating layer" and "second insulating layer" do not necessarily mean the first insulating layer is positioned on top of the second insulating layer, or is generated earlier than the second insulating layer. In fact, these phrases are only used to identify different insulating layers.

In the claims, any reference sign in parentheses should not be interpreted as a limitation to the claims. The term "comprise/include" does not exclude the presence of elements or steps other than those listed in the claims. The word "a" or "an" in front of elements does not exclude the presence of a plurality of such elements. The present invention can be carried out by means of hardware including a plurality of separate elements, or by appropriately programmed software or firmware, or by any combination thereof.

In device or system claims that enumerate several means or components, one or more of the means or components can be embodied in one and the same item of hardware. The mere fact that some measures are recited in dependent claims that are different from each other does not indicate that the combination of the measures cannot be used to advantage.

What is claimed is:

1. A fingerprint identification unit, comprising:
a photosensitive device on which a first insulating layer is formed for insulating the photosensitive device from an OLED luminescent layer, wherein the part of the OLED luminescent layer corresponding to the photosensitive device does not illuminate;
a data read-out signal line configured to read out a photocurrent generated by the photosensitive device; and
a thin film transistor for controlling the switching of the photosensitive device, the gate of the thin film transistor being electrically connected with a control signal line, wherein the control signal line is configured to control the switching of the thin film transistor.

2. The fingerprint identification unit according to claim 1, wherein a first electrode of the photosensitive device is electrically connected with a reference voltage data line, a source of the thin film transistor is electrically connected with the data read-out signal line, and a drain of the thin film transistor is electrically connected with a second electrode of the photosensitive device.

3. The fingerprint identification unit according to claim 2, wherein the first electrode of the photosensitive device is a P electrode, and the second electrode thereof is an N electrode.

4. The fingerprint identification unit according to claim 1, wherein the photosensitive device is a PIN photosensitive device, a PN photosensitive device or a Schottky photosensitive device.

5. The fingerprint identification unit according to claim 1, wherein the thin film transistor comprises a buffer layer, an active layer, a gate insulating layer, a gate, a source and a drain, the active layer is formed on the buffer layer, the gate insulating layer is formed on the active layer, the gate, the source and the drain are respectively formed on the gate insulating layer, the gate insulating layer is provided with a first through-hole and a second through-hole, the source is electrically connected with the active layer by a first lead wire passing through the first through-hole, and the drain is electrically connected with the active layer by a second lead wire passing through the second through-hole.

6. The fingerprint identification unit according to claim 1, wherein the fingerprint identification unit also comprises a second insulating layer provided with a third through-hole, and the second insulating layer is located between the thin film transistor and the first insulating layer; the photosensitive device is located between the second insulating layer and the first insulating layer; and the second electrode of the photosensitive device is electrically connected with the drain of the thin film transistor by a third lead wire passing through the third through-hole.

7. The fingerprint identification unit according to claim 6, wherein a first protective layer is formed between the lower surface of the second insulating layer and the thin film transistor, on the upper surface of the second insulating layer is also formed a metal layer electrically connected with the reference voltage data line, the photosensitive device is formed on the metal layer, on the upper surface of the second insulating layer and around the photosensitive device is formed a second protective layer for insulating the first electrode of the photosensitive device from the second electrode thereof; wherein
the first electrode of the photosensitive device is in contact with the metal layer, and the second electrode thereof is exposed out of the second protective layer that is in contact with the first insulating layer;
the first protective layer is provided with a fourth through-hole, the second protective layer is provided with a fifth through-hole, the fourth through-hole is in communication with the fifth through-hole via the third through-hole, and the third lead wire passes through the fourth through-hole and the fifth through-hole respectively.

8. An array substrate comprising an fingerprint identification unit according to claim 1.

9. The array substrate according to claim 8, wherein each pixel unit of the array substrate comprises a pixel compensation unit and a fingerprint identification unit, and the photosensitive device of the fingerprint identification unit corresponds to the non-illuminating area of the OLED luminescent layer.

10. The array substrate according to claim 9, wherein the pixel compensation unit and the fingerprint identification unit of each pixel unit are disposed on a base substrate.

11. A display device comprising an array substrate according to claim 8.

12. A fingerprint identification method using a display device according to claim 11, comprising the steps of:
providing a control signal by a control signal line of each of fingerprint identification units to a gate of a thin film transistor so that the thin film transistor turns on a photosensitive device;
receiving the light, which was emitted from the display device and reflected by the fingerprint area, by the photosensitive device of each of the fingerprint identification units so that a photoelectric conversion of the reflected light is conducted in the photosensitive device to generate a photocurrent;
reading out the amount of the photocurrent by a data read-out signal line of each of the fingerprint identification units so as to identify fingerprint valleys and fingerprint ridges of the fingerprint area according to the amount of the photocurrent read out by the data read-out signal line in the different fingerprint identification units.

13. The fingerprint identification method according to claim 12, wherein the fingerprint identification method also comprises:
acquiring an operational state of the display device, and controlling the control signal line of each of the pixel compensation units to provide a control signal to the gate of the thin film transistor when the display device is in operation.

14. A manufacturing method of a fingerprint identification unit, comprising:
forming a thin film transistor, a photosensitive device, a control signal line and a data read-out signal line so that the thin film transistor controls the switching of the photosensitive device, the data read-out signal line reads out a photocurrent generated by the photosensitive device, a gate of the thin film transistor is electrically connected with the control signal line, a first electrode of the photosensitive device is electrically connected with a reference voltage data line; and
forming a first insulating layer on the photosensitive device to obtain a fingerprint identification unit, the first insulating layer being used for insulating the photosensitive device from an OLED luminescent layer so that the part of the OLED luminescent layer corresponding to the photosensitive device does not illuminate.

15. The manufacturing method of a fingerprint identification unit according to claim 14, wherein the step of forming a thin film transistor comprises:

forming a buffer layer, forming an active layer on the buffer layer, and forming a gate insulating layer on the active layer;

forming a gate on the gate insulating layer so that the gate is electrically connected with the control signal line;

forming a first through-hole and a second through-hole in the gate insulating layer by a patternizing process;

forming a first lead wire in the first through-hole and a second lead wire in the second through-hole;

forming a source and a drain on the gate insulating layer so that the source is electrically connected with the active layer by the first lead wire, the drain is electrically connected with the active layer by the second lead wire, the source is electrically connected with the data read-out signal line, and the drain is electrically connected with a second electrode of the photosensitive device to obtain the thin film transistor.

16. The manufacturing method of a fingerprint identification unit according to claim 15, wherein the manufacturing method of the fingerprint identification unit also comprises:

forming a first protective layer on the source of the thin film transistor, the drain of the thin film transistor and the gate of the thin film transistor;

forming a second insulating layer on the first protective layer so that the lower surface of the second insulating layer is confronted with the first protective layer;

forming a metal layer connected with the reference voltage data line on the upper surface of the second insulating layer, wherein the photosensitive device is formed on the metal layer so that the first electrode of the photosensitive device is in contact with the metal layer;

forming a second protective layer on the upper surface of the second insulating layer and around the photosensitive device so that the first electrode of the photosensitive device is insulated from the second electrode thereof, the second electrode of the photosensitive device is exposed out of the second protective layer, and the second protective layer is in contact with the first insulating layer;

forming a fourth through-hole in the first protective layer, a third through-hole in the second insulating layer, and a fifth through-hole in the second protective layer by a patternizing process, the fourth through-hole being in communication with the fifth through-hole via the third through-hole; and forming a third lead wire in the second electrode of the photosensitive device, the fifth through-hole, the third through-hole and the fourth through-hole so that the second electrode of the photosensitive device is electrically connected with the drain of the thin film transistor by the third lead wire passing through the fifth through-hole, the third through-hole and the fourth through-hole.

17. The manufacturing method of a fingerprint identification unit according to claim 15, wherein the control signal line and the gate of the thin film transistor are formed by the patternizing process at the same time, and the data read-out signal line, the source of the thin film transistor and the drain of the thin film transistor are formed by the patternizing process at the same time.

18. The manufacturing method of a fingerprint identification unit according to claim 14, wherein the manufacturing method of the fingerprint identification unit also comprises:

forming a first protective layer on the source of the thin film transistor, the drain of the thin film transistor and the gate of the thin film transistor;

forming a second insulating layer on the first protective layer so that the lower surface of the second insulating layer is confronted with the first protective layer;

forming a metal layer connected with the reference voltage data line on the upper surface of the second insulating layer, wherein the photosensitive device is formed on the metal layer so that the first electrode of the photosensitive device is in contact with the metal layer;

forming a second protective layer on the upper surface of the second insulating layer and around the photosensitive device so that the first electrode of the photosensitive device is insulated from the second electrode thereof, the second electrode of the photosensitive device is exposed out of the second protective layer, and the second protective layer is in contact with the first insulating layer;

forming a fourth through-hole in the first protective layer, a third through-hole in the second insulating layer, and a fifth through-hole in the second protective layer by a patternizing process, the fourth through-hole being in communication with the fifth through-hole via the third through-hole; and forming a third lead wire in the second electrode of the photosensitive device, the fifth through-hole, the third through-hole and the fourth through-hole so that the second electrode of the photosensitive device is electrically connected with the drain of the thin film transistor by the third lead wire passing through the fifth through-hole, the third through-hole and the fourth through-hole.

19. The manufacturing method of a fingerprint identification unit according to claim 14, wherein the control signal line and the gate of the thin film transistor are formed by the patternizing process at the same time, and the data read-out signal line, the source of the thin film transistor and the drain of the thin film transistor are formed by the patternizing process at the same time.

* * * * *